United States Patent [19]

Finley

[11] Patent Number: 5,709,938
[45] Date of Patent: Jan. 20, 1998

[54] CATHODE TARGETS OF SILICON AND TRANSITION METAL

[75] Inventor: James J. Finley, Pittsburgh, Pa.

[73] Assignee: PPG Industries, Inc., Pittsburgh, Pa.

[21] Appl. No.: 398,932

[22] Filed: Mar. 6, 1995

Related U.S. Application Data

[63] Continuation-in-part of Ser. No. 41,015, Mar. 31, 1993, Pat. No. 5,417,827, which is a continuation-in-part of Ser. No. 981,706, Nov. 25, 1992, which is a continuation-in-part of Ser. No. 799,806, Nov. 29, 1991.

[51] Int. Cl.$^6$ .................................................. C03C 17/34
[52] U.S. Cl. .......................... 428/336; 428/432; 428/428; 428/697; 428/698; 428/699; 428/701; 428/702; 428/913; 359/580; 359/581
[58] Field of Search ........................... 428/698, 699, 428/697, 701, 702, 336, 428, 432, 913; 359/580, 581

[56] References Cited

U.S. PATENT DOCUMENTS

| | | | |
|---|---|---|---|
| 4,157,315 | 6/1979 | Michels et al. | 252/458 |
| 4,450,201 | 5/1984 | Brill et al. | |
| 4,769,291 | 9/1988 | Belkind et al. | |
| 4,847,157 | 7/1989 | Goodman et al. | |
| 4,990,234 | 2/1991 | Szczyrbowski et al. | |
| 4,992,087 | 2/1991 | Holscher. | |
| 5,170,291 | 12/1992 | Szczyrbowski et al. | |
| 5,320,729 | 6/1994 | Narizuka et al. | |
| 5,417,827 | 5/1995 | Finley | 204/197.28 |

FOREIGN PATENT DOCUMENTS

| | | |
|---|---|---|
| 550365 | 9/1956 | Belgium. |
| 0 226 993 | 7/1987 | European Pat. Off. |
| 0 239 280 | 9/1987 | European Pat. Off. |
| 0 281 894 | 9/1988 | European Pat. Off. |
| 0 301 755 | 2/1989 | European Pat. Off. |
| 63-242948 | 10/1988 | Japan. |
| 2201428 | 9/1988 | United Kingdom. |

OTHER PUBLICATIONS

"Properties of d.c. Magnetron Sputtered NiSiO$_x$–Films" by J. Szczyrbowski et al., SPIE vol. 1272, pp. 38–45, *Optical Materials Technology for Energy and Solar Energy Conversion IX* (1990).

Francois et al., "Reflectivity of ScN$_x$ Thin Films: Comparison with TiN$_x$, TiN$_x$C$_y$ and ZrN$_x$ Coatings and Applications to the Photothermal Conversation of Solar Energy", *Thin Solid Films*, 127 (1985) pp. 205–214.

Valkonen et al., "Selective Transition of Thin TiN–Films", *SPIE Int. Soc. Opt. Eng.*, 1983, pp. 375–380.

Chemical Abstracts, vol. 111, No. 2, 10 Jul. 1989, Columbus, Ohio, US; abstract No. 11542q, p. 271; JP 63–242, 948.

Chemical Abstracts, vol. 114, No. 18, 6 May 1991, Columbus, Ohio, US; abstract No. 169829k, p. 346, JP 02–223,534.

*Primary Examiner*—Archene Turner
*Attorney, Agent, or Firm*—Raymond J. Harmuth

[57] ABSTRACT

Silicon-chromium cathode targets comprising 5 to 80 weight percent chromium are disclosed for sputtering absorbing coatings of silicon-chromium alloy in atmospheres comprising inert gas, reactive gases such as nitrogen, oxygen, and mixtures thereof which may further comprise inert gas, such as argon, to form nitrides, oxides, and oxynitrides as well as metallic films. The presence of chromium in the cathode target in the range of 5 to 80 weight percent provides target stability and enhanced sputtering rates over targets of silicon alone, comparable to the target stability and sputtering rates of silicon-nickel, not only when sputtering in oxygen to produce an oxide coating, but also when sputtering in inert gas, nitrogen or a mixture of nitrogen and oxygen to produce coatings of silicon-chromium, silicon-chromium nitride or silicon-chromium oxynitride respectively. The chromium in the target may be replaced in part with nickel, preferably in the range of 5 to 15 weight percent, to produce coatings of silicon-chromium-nickel and the oxides, nitrides and oxynitrides thereof.

24 Claims, 2 Drawing Sheets

# CATHODE TARGETS OF SILICON AND TRANSITION METAL

CROSS-REFERENCE TO RELATED APPLICATION

This application is a continuation-in-part of U.S. application Ser. No. 08/041,015 filed Mar. 31, 1993, entitled "Cathode Targets of Silicon and Transition Metal", U.S. Pat. No. 5,417,827 which is a continuation-in-part of U.S. application Ser. No. 07/981,706 filed Nov. 25, 1992, entitled "Reactive Sputtering of Silicon and Transition Metals" pending, which is a continuation-in-part of U.S. application Ser. No. 07/799,806 filed Nov. 29, 1991, entitled "Multilayer Heat Processable Vacuum Coatings With Metallic Properties" pending.

BACKGROUND

1. Field of the Invention

The present invention relates generally to the art of sputtering silicon-containing target materials and to the art of fabricating cathode targets of silicon alloys comprising transition metal.

2. Description of the Related Art

U.S. Pat. Nos. 4,990,234 and 5,170,291 to Szczyrbowski et al. disclose sputtering silica and silicides, such as nickel silicide ($NiSi_2$), in an oxidizing atmosphere to deposit dielectric oxide films.

U.S. Pat. No. 5,320,729 to Narizuka et al. discloses a sputtering target with which a high resistivity thin film consisting of chromium, silicon and oxygen can be produced. The target is formed by selecting the grain size of chromium powder and silicon dioxide powder drying the powders by heating and mixing the dried powders to obtain a mixed powder containing from 20 to 80 percent by weight of chromium, preferably 50 to 80 percent, the remainder being silicon dioxide, packing the mixed powder in a die, and sintering the packed powder by hot pressing to produce a target which has a two phase mixed structure. The sputtering target is used to manufacture thin film resistors and electrical circuits.

SUMMARY OF THE INVENTION

The present invention involves cathode targets of silicon alloys containing a transition metal such as chromium, chromium-nickel, or iron. Targets of silicon alloys containing chromium, chromium-nickel or iron may be sputtered in an atmosphere comprising inert gas, nitrogen, oxygen and mixtures thereof to produce silicon-metal containing coatings including oxides, nitrides and oxynitrides, as well as metallic films. The silicon-metal cathode target compositions of the present invention comprise sufficient metal to provide target stability and a desirable sputtering rate.

Adding chromium, which as an oxide or nitride is very hard and chemically resistant, to the silicon provides a mechanically and chemically durable silicon alloy compound coating. When the alloy is sputtered in pure argon, the resultant silicon alloy coating is harder than silicon.

The purpose of these silicon-chromium, silicon-chromium-nickel and silicon-iron alloys is to provide target materials which sputter readily, in inert gas, reactive gas or gas mixtures, to produce extremely durable coatings with variable optical properties. Each target material combination produces coatings with different optical constants, i.e. refractive index and absorption coefficient. These optical constants generally increase as the percentage of chromium, chromium-nickel or iron in the silicon alloy increases. When sputtered reactively, each target material combination also produces coatings with a range of optical constants, which generally increase as the reactive gas mixture, with or without inert gas such as argon, is varied from oxygen, to combinations of oxygen and nitrogen with increasing proportions of nitrogen, to nitrogen.

DESCRIPTION OF THE PREFERRED EMBODIMENTS

Figure 1:
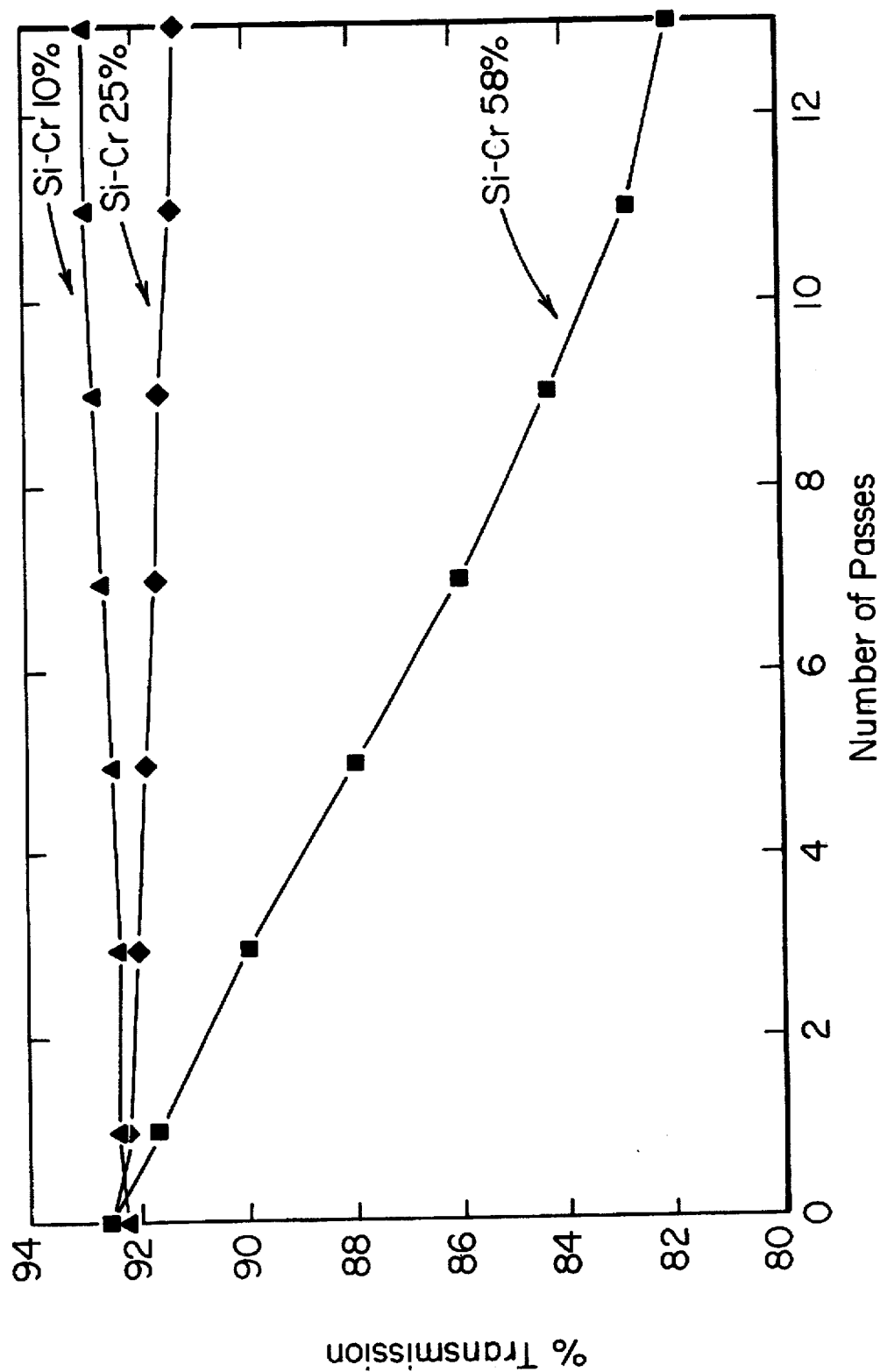
FIG. 1 illustrates the transmittance of coated articles in accordance with the present invention as a function of coating thickness, represented by the number of passes of a substrate under a cathode target of various compositions of silicon and chromium sputtered in an atmosphere of 50 percent oxygen in argon. The cathode target compositions are 10, 25 and 58 weight percent chromium based on the combined weight of chromium and silicon.
Figure 2:
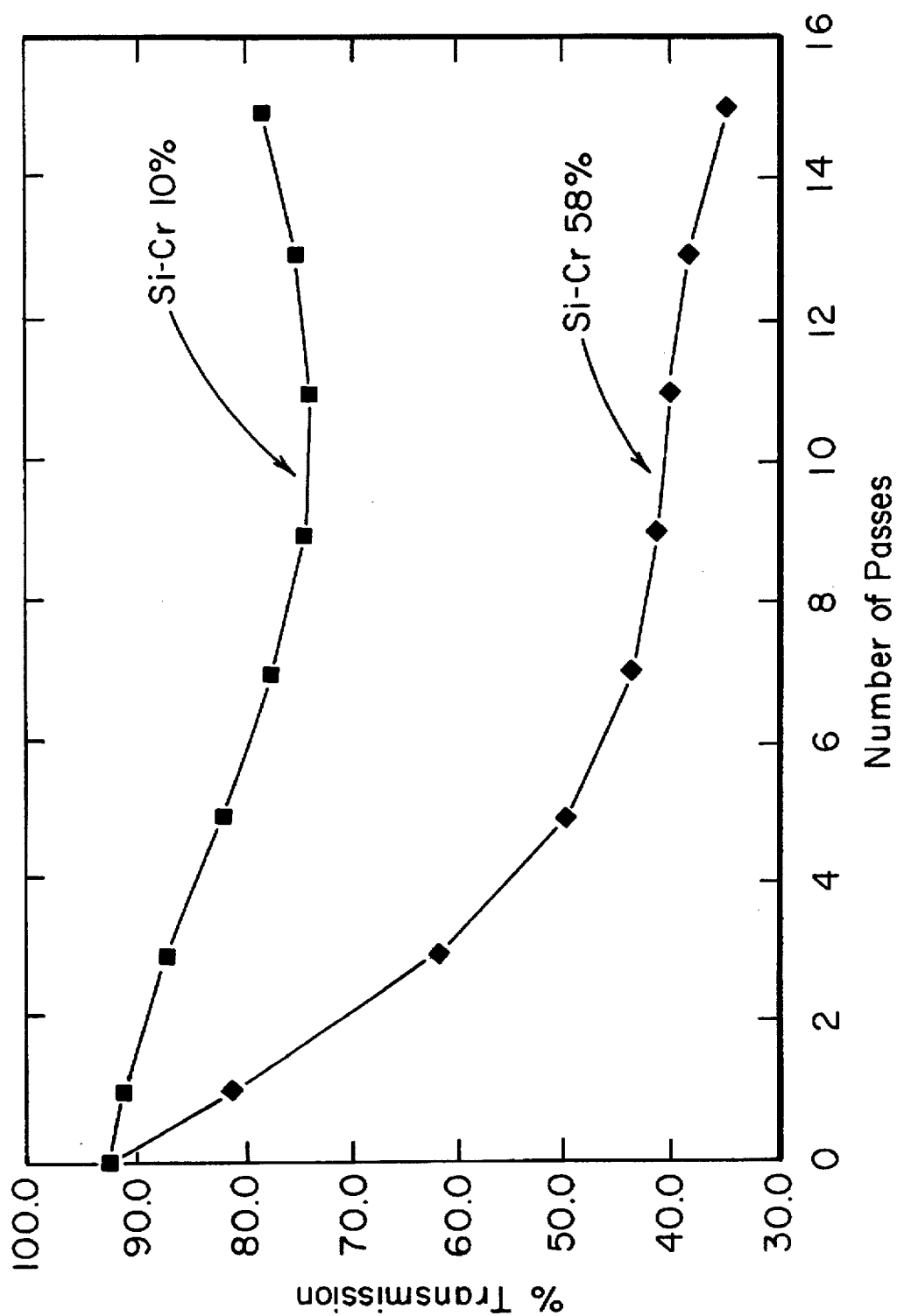
FIG. 2 illustrates the transmittance of coated articles in accordance with the present invention as a function of coating thickness, represented by number of passes of a substrate under a cathode target of various compositions of silicon and chromium sputtered in a nitrogen atmosphere. The cathode target compositions are 10 and 58 weight percent chromium based on the combined weight of chromium and silicon.

In accordance with the present invention, oxides, nitrides and oxynitrides of silicon-chromium, silicon-chromium-nickel and silicon-iron are sputtered using dc magnetron sputtering. For this purpose, silicon-chromium, silicon-chromium-nickel and silicon-iron cathode targets of the present invention are used for the sputtering targets. Coating transmission is measured as an indicator of the optical properties of refractive index and absorption coefficient as shown in FIGS. 1 and 2.

The silicon-chromium, silicon-chromium-nickel, and silicon-iron cathode targets of the invention are found to sputter with arcing and rates comparable to silicon-nickel alloys. Since it is desirable in a production process to use the same target material for many coating applications and vary the reactive gas to sputter different compositions, the chromium, chromium-nickel or iron content in accordance with the present invention is kept high enough to give the desirable sputtering rate and target stability.

Silicon-chromium alloy cathode targets ranging between 5 and 80 weight percent, preferably 10 to 60 weight percent, most preferably 10 to 50 weight percent, chromium are sputtered in argon, nitrogen, and/or oxygen; preferably in an argon-oxygen gas mixture with up to 50 percent oxygen, or in a nitrogen-oxygen gas mixture containing up to 40 percent oxygen. When the coating includes silicon and chromium, the weight percent chromium in the coating based on the combined weight of silicon and chromium is from 5 to 80%. When the coating includes silicon and chromium and is sputtered in an inert atmosphere, the weight percent chromium in the coating based on the combined weight of silicon and chromium is 5 to 50%. Silicon-chromium alloy cathode targets may have some of the chromium substituted with nickel. The amount of nickel is preferably below 15 percent by weight based on the combined weight of silicon, chromium and nickel. The amount of nickel is preferably below 15 percent, preferably in the range of 5 to 15 percent, with at least 5 percent chromium based on the total weight of silicon, chromium and nickel.

Silicon-chromium-nickel alloy cathode targets with 5 to 15 weight percent nickel and 5 to 65 weight percent chromium, preferable 5 to 10 weight percent nickel and 5 to 40 weight percent chromium, are preferably sputtered in inert gas such as argon, in argon-oxygen gas mixtures with up to 50 percent oxygen, and in nitrogen-oxygen gas mixtures containing up to 40 percent oxygen. Silicon-iron alloy cathode targets preferably contain up to 20 weight percent iron based on the combined weight of silicon, but may contain more iron or other transition metal subject to the limitation that the alloy remain nonmagnetic for magnetron sputtering.

The silicon-chromium, silicon-chromium-nickel and silicon-iron cathode target compositions of the present invention are determined by the DC Plasma Emission method from pieces of target material to determine weight percent of chromium, nickel or iron. The coating compositions are measured using X-ray fluorescence to determine the weight percent chromium, nickel or iron.

In particularly preferred embodiments of the present invention, as illustrated in FIGS. 1 and 2, silicon-chromium alloys having compositions with 58, 25 and 10 percent weight chromium are reactively sputtered. The alloy containing 58 percent chromium deposits a coating with strong absorption both as an oxide and nitride, as indicated by the decrease in transmission with increasing number of passes. The alloy containing 25 percent chromium deposits a coating which shows some absorption as an oxide. The alloy containing 10 percent chromium deposits a coating which, as an oxide, shows insignificant absorption, and a refractive index which is less than the refractive index of the glass substrate. This is evident because the transmission increases above that of the substrate (6.0 mm float glass) as the coating is deposited. The nitride coatings of all the alloys containing chromium show strong absorption. FIGS. 1 and 2 illustrate these properties of the oxide and nitride respectively. As shown in FIG. 1, the coating transmission as a function of coating thickness, shown as number of passes, indicates that the absorption and the refractive index of the coatings generally increase as the chromium content increases.

In a preferred embodiment of the present invention, coatings are produced on a large-scale magnetron sputtering device capable of coating glass up to 100×144 inches (2.54×3.66 meters). In the following examples, the coatings are deposited on a smaller scale, using planar magnetron cathodes having 5×17 inch (12.7×43.2 centimeters) silicon-chromium targets. Base pressure is in the $10^{-6}$ Torr range. The coatings are made by first admitting the sputtering gas to a pressure of 4 millitorr and then setting the cathode at constant power of 3 kilowatts (kw). In each example, 6 millimeter thick glass substrates pass under the target on a conveyor roll at a speed of 120 inches (3.05 meters) per minute. The transmittance is monitored every other pass during the sputtering process at a wavelength of 550 nanometers using a Dyn-Optics 580D optical monitor.

EXAMPLE 1

A sample is prepared using a silicon-chromium cathode target containing 58 weight percent chromium in an oxygen-argon gas mixture with an oxygen flow of 106 standard cubic centimeters per minute (sccm) and an argon flow of 108 sccm. The cathode voltage is 548 volts. The sputtered film deposited in this oxygen-argon gas mixture is 58 weight percent chromium based on the total weight of silicon and chromium in the film. The transmittance of the coating, monitored at 550 nanometers, is 81.2 percent after 29 passes. The coating thickness is 1593 Angstroms.

EXAMPLE 2

A sample is prepared using a silicon-chromium cathode target containing 25 weight percent chromium in an oxygen-argon gas mixture with an oxygen flow of 46 sccm and an argon flow of 46 sccm. The cathode voltage is 381 volts. The sputtered film deposited in this oxygen-argon gas mixture is 23 weight percent chromium based on the total weight of silicon and chromium in the film. The transmittance of the coating, monitored at 550 nanometers, is 89.8 percent after 39 passes. The coating thickness is 2123 Angstroms.

EXAMPLE 3

A sample is prepared using a silicon-chromium cathode target containing 10 weight percent chromium in an oxygen-argon gas mixture with an oxygen flow of 46 sccm and an argon flow of 46 sccm. The cathode voltage is 348 volts. The sputtered film deposited in this oxygen-argon gas mixture is 8.2 weight percent chromium based on the total weight of silicon and chromium in the film. The transmittance of the coating, monitored at 550 nanometers, is 92.8 percent after 16 passes. The coating thickness is 1044 Angstroms.

EXAMPLE 4

A sample is prepared using a silicon-chromium cathode target containing 58 weight percent chromium in pure nitrogen gas atmosphere with a flow of 158 standard cubic centimeters per minute (sccm). The cathode voltage is 564 volts. The transmittance of the coating, monitored at 550 nanometers, is 9.8 percent after 35 passes.

EXAMPLE 5

A sample is prepared using a silicon-chromium cathode target containing 10 weight percent chromium in pure nitrogen gas atmosphere with a flow of 100 standard cubic centimeters per minute (sccm). The cathode voltage is 495 volts. The sputtered film deposited in this nitrogen gas is 10.3 weight percent chromium based on the total weight of silicon and chromium in the film. The transmittance of the coating, monitored at 550 nanometers, is 80.0 percent after 16 passes. The coating thickness is 1053 Angstroms.

EXAMPLE 6

A sample is prepared using a silicon-chromium-nickel cathode target containing 5 weight percent chromium and 15 weight percent nickel in pure nitrogen gas atmosphere with a flow of 160 standard cubic centimeters per minute (sccm). The cathode voltage is 517 volts. The sputtered film deposited in this nitrogen gas is 4.8 weight percent chromium and 15.5 weight percent nickel based on the total weight of silicon, chromium, and nickel in the film. The transmittance of the coating, monitored at 550 nanometers, is 66.7 percent after 12 passes. The coating thickness is 782 Angstroms.

EXAMPLE 7

A sample is prepared using a silicon-chromium-nickel cathode target containing 10 weight percent chromium and 10 weight percent nickel in pure nitrogen gas atmosphere with a flow of 102 standard cubic centimeters per minute (sccm). The cathode voltage is 506 volts. The sputtered film deposited in this nitrogen gas is 9.6 weight percent chromium and 10.4 weight percent nickel based on the total weight of silicon, chromium, and nickel in the film. The transmittance of the coating, monitored at 550 nanometers, is 68.0 percent after 12 passes. The coating thickness is 750 Angstroms.

EXAMPLE 8

A sample is prepared using a silicon-chromium-nickel cathode target containing 5 weight percent chromium and 15 weight percent nickel in an oxygen-argon gas mixture with an oxygen flow of 75 sccm and an argon flow of 75 sccm. The cathode voltage is 373 volts. The sputtered film deposited in this oxygen-argon gas mixture is 4.1 weight percent chromium and 11.3 weight percent nickel based on the total weight of silicon, chromium, and nickel in the film. The transmittance of the coating, monitored at 550 nanometers, is 89.0 percent after 12 passes. The coating thickness is 781 Angstroms.

EXAMPLE 9

A sample is prepared using a silicon-chromium-nickel cathode target containing 10 weight percent chromium and 10 weight percent nickel in an oxygen-argon gas mixture with an oxygen flow of 44 sccm and an argon flow of 44 sccm. The cathode voltage is 377 volts. The sputtered film deposited in this oxygen-argon gas mixture is 9.3 weight percent chromium and 7.3 weight percent nickel based on the total weight of silicon, chromium, and nickel in the film. The transmittance of the coating, monitored at 550 nanometers, is 91.9 percent after 12 passes. The coating thickness is 704 Angstroms.

EXAMPLE 10

A sample is prepared using a silicon-iron cathode target containing 8 weight percent iron in pure nitrogen gas atmosphere with a flow of 92 sccm. The cathode voltage is 475 volts. The transmittance of the coating, monitored at 550 nanometers, is 80.3 percent after 14 passes. The coating thickness is 698 Angstroms.

EXAMPLE 11

A sample is prepared using a silicon-chromium-nickel cathode target containing 5 weight percent chromium and 14 weight percent nickel in pure argon gas atmosphere with a flow of 136 sccm. The cathode voltage is 932 volts. The transmittance of the coating, monitored at 550 nanometers, is 3.2 percent after 6 passes. The coating thickness is 732 Angstroms.

The above examples illustrate the present invention which relates to using silicon-chromium, silicon-chromium-nickel and silicon-iron cathode targets sputtered in pure nitrogen, in nitrogen-oxygen mixtures ranging up to 40 percent oxygen, and in argon-oxygen mixtures comprising up to 50 percent oxygen. Based on the data illustrated in the figures, a single silicon-alloy cathode target containing a given weight percentage of chromium, chromium-nickel or iron can be used for stable sputtering of a range of film compositions including oxides, nitrides and oxynitrides with varying absorption at high sputtering rates. The above examples illustrate the concept of the present invention, the scope of which is defined by the following claims.

What is claimed is:

1. A coated article comprising:
   a nonmetallic substrate;
   a sputter coating over a surface of the substrate, the sputter coating including an alloy present in the coating as a compound selected from the group consisting of a sputtered oxide compound, a sputtered nitride compound, a sputtered oxynitride compound and a sputtered metallic film and the alloy selected from the group consisting of a silicon-chromium alloy, a silicon-chromium-nickel alloy and a silicon-iron alloy.

2. The coated article of claim 1 wherein the substrate is glass.

3. The coated article of claim 2 wherein the coated article has a transmittance at 550 nanometers of at least about 3.2%.

4. The coated article of claim 2 wherein the coated article has a transmittance at 550 nanometers of less than about 92.8%.

5. The coated article of claim 1 wherein said sputter coating has a thickness of at least about 698 Angstroms.

6. The coated article of claim 1 wherein said sputter coating has a thickness of less than about 2123 Angstroms.

7. The coated article of claim 1 wherein said sputter coating is sputtered in an atmosphere selected from the group consisting of inert gas, nitrogen, oxygen and mixtures thereof.

8. The coated article of claim 1 wherein said alloy is selected from the group consisting of said silicon-chromium alloy and said silicon-chromium-nickel alloy and wherein the weight percent chromium in the sputter coating based on the combined weight of silicon and chromium in the sputter coating is from about 5% to about 80%.

9. The coated article of claim 8 wherein the sputter coating is sputtered in an atmosphere that consists essentially of an inert gas, and wherein the weight percent chromium in the sputter coating based upon the combined weight of silicon and chromium in the sputter coating is from about 5% to about 50%.

10. The coated article of claim 1 wherein said alloy is a silicon-chromium alloy and the sputter coating is formed by magnetron sputtering of a silicon-chromium alloy cathode target, the target having a weight percent of chromium of about 5% to about 80% based upon the combined weight of silicon and chromium in the target.

11. The coated article of claim 1 wherein said alloy is a silicon-chromium-nickel alloy and wherein the weight percent of nickel in said sputter coating is at least about 7.3% and is less than about 15.5% based upon the combined weight of silicon, chromium and nickel in the sputter coating, and the weight percent of chromium in said sputter coating is at least about 4.1% and is less than about 9.6% based on the combined weight of silicon, chromium and nickel in the sputter coating.

12. The article of claim 1 wherein said alloy is a silicon-chromium-nickel alloy and the sputter coating is formed by magnetron sputtering of a silicon-chromium-nickel alloy cathode target, the target having a weight percent of chromium of about 5% to about 65% based upon the combined weight of silicon, chromium and nickel in the target, the target having a weight percent of nickel of about 5% to about 15% based on the combined weight of silicon, chromium and nickel in the target.

13. The article of claim 1 wherein said alloy is a silicon-iron alloy and the sputter coating is formed by magnetron sputtering of a silicon-iron alloy cathode target, the target having up to about 20 weight percent iron based on the combined weight of silicon and iron in the target.

14. A coated article comprising:
   a nonmetallic substrate, and
   a sputter coating over a surface of the substrate, the sputter coating including silicon and chromium wherein the weight percent chromium based on the combined weight of silicon and chromium in the coating is from 5 to 80 percent.

15. A coated article according to claim 14 wherein said coating further comprises nickel.

16. A coated article according to claim 15, wherein said coating further comprises an element selected from the group consisting of oxygen, nitrogen and mixtures thereof.

17. The coated article according to claim 15 wherein the coated article has a transmittance at 550 nanometers of at least about 3.2% and less than about 91.9%.

18. The coated article according to claim 15 wherein said sputter coating has a thickness of less than about 2123 Angstroms.

19. A coated article according to claim 14, wherein said coating further comprises an element selected from the group consisting of oxygen, nitrogen and mixtures thereof.

20. The coated article according to claim 14 wherein the coated article has a transmittance at 550 nanometers of at least about 66.7% and less than about 92.8%.

21. The coated article according to claim 14 wherein said sputter coating has a thickness of less than about 2123 Angstroms.

22. The coated article according to claim 21 wherein the coated article has a transmittance at 550 nanometers of at least about 66.7% and less than about 92.8%.

23. The coated article according to claim 14 wherein the substrate is glass.

24. A coated article comprising:

a nonmetallic substrate;

a sputter coating over a surface of the substrate, the sputter coating including an alloy selected from the group consisting of a silicon-chromium alloy, a silicon-chromium-nickel alloy and a silicon-iron alloy, wherein the alloy is present in the coating as a compound selected from the group consisting of a sputtered oxide compound, a sputtered nitride compound, a sputtered oxynitride compound and a sputtered metallic film, the coated article having a transmittance at 550 nanometers of at least 3.2% and less than about 92.8% and a sputter coating thickness of less than about 2123 Angstroms.

* * * * *